(12) United States Patent
Weiblen et al.

(10) Patent No.: US 6,804,883 B1
(45) Date of Patent: Oct. 19, 2004

(54) METHOD FOR PRODUCING A PRESSURE SENSOR

(75) Inventors: Kurt Weiblen, Metzingen (DE); Anton Doering, Reutlingen (DE); Juergen Nieder, Reutlingen (DE); Frieder Haag, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 331 days.

(21) Appl. No.: 09/603,060

(22) Filed: Jun. 26, 2000

(30) Foreign Application Priority Data

Jun. 25, 1999 (DE) .......................................... 199 29 028

(51) Int. Cl.[7] ...................... H01R 43/00; H05K 13/00; H01F 7/06; B32B 18/00; B32B 31/12; B32B 3/26

(52) U.S. Cl. ............................. 29/854; 29/854; 29/855; 29/857; 29/858; 29/592.1; 29/594; 29/602.1; 264/135; 264/271.1; 264/272.11; 264/294

(58) Field of Search ........................... 29/854–858, 860, 29/868, 869, 592, 592.1, 594, 602.1; 264/135, 271.1, 272, 272.11, 294, 255, 272.4

(56) References Cited

U.S. PATENT DOCUMENTS

| | | | | |
|---|---|---|---|---|
| 3,706,840 A | * | 12/1972 | Moyle et al. ............... | 174/52.2 |
| 4,665,754 A | * | 5/1987 | Glenn et al. ............... | 29/621.1 |
| 5,270,262 A | * | 12/1993 | Switky et al. ................ | 29/827 |
| 5,395,226 A | * | 3/1995 | Sakai et al. ................. | 425/116 |
| 5,465,626 A | * | 11/1995 | Brown et al. ................ | 73/706 |
| 5,509,312 A | * | 4/1996 | Donzier et al. .......... | 73/152.52 |
| 5,600,071 A | * | 2/1997 | Sooriakumar et al. ........ | 73/721 |
| 5,724,626 A | * | 3/1998 | Todoki ....................... | 271/286 |
| 5,744,084 A | * | 4/1998 | Chia et al. .................... | 264/276 |
| 5,798,070 A | * | 8/1998 | Sakai et al. ............ | 264/272.17 |
| 5,859,471 A | * | 1/1999 | Kuraishi et al. ............. | 257/666 |
| 5,891,751 A | * | 4/1999 | Kurtz et al. .......... | 148/DIG. 12 |
| 6,041,495 A | * | 3/2000 | Yoon et al. .................... | 29/825 |
| 6,047,468 A | * | 4/2000 | Fogal et al. .............. | 228/110.1 |
| 6,092,281 A | * | 7/2000 | Glenn ......................... | 257/687 |
| 6,211,462 B1 | * | 4/2001 | Carter et al. ................ | 174/52.4 |
| 6,215,176 B1 | * | 4/2001 | Huang ......................... | 257/666 |
| 6,254,815 B1 | * | 7/2001 | Cheperak ..................... | 264/135 |
| 6,255,741 B1 | * | 7/2001 | Yoshihara et al. ........... | 257/414 |
| 6,329,606 B1 | * | 12/2001 | Freyman et al. ............. | 174/260 |

OTHER PUBLICATIONS

Ricken et al., *Advanced Microsystems for Automotive Applications*, '99, p. 126.

* cited by examiner

Primary Examiner—Jessica Harrison
Assistant Examiner—Binh-An D. Nguyen
(74) Attorney, Agent, or Firm—Kenyon & Kenyon

(57) ABSTRACT

A method for producing a pressure sensor, in which a semiconductor pressure pick-up is mounted on a mounting section of a lead grid, in particular a leadframe. The semiconductor pressure pick-up is electrically connected to contact sections of the lead grid. The lead grid, together with the semiconductor pressure pick-up, is inserted into an injection molding die. A die part is brought into contact at the side of the semiconductor pressure pick-up facing away from the mounting section or at side of the mounting section facing away from the semiconductor pressure pick-up. The semiconductor pressure pick-up in the injection molding die is subsequently enclosed by a housing made of mold compound. In order to prevent the mounting section from giving way, it is proposed to clamp the mounting section of the lead grid in the injection molding die when producing the housing.

5 Claims, 3 Drawing Sheets

METHOD FOR PRODUCING A PRESSURE SENSOR

FIELD OF THE INVENTION

The present invention relates to a method for producing a pressure sensor.

BACKGROUND INFORMATION

A method for producing a pressure sensor has been described, for example, in the printed document "*Advanced Microsystems for Automotive Applications*" '99, D. E. Ricken, W. Gessner, page 126. In the method described in this publication, a semiconductor pressure pick-up, which includes a semiconductor chip with pressure diaphragm mounted on a socket, is applied onto a lead grid, a so-called leadframe. A level section of the lead grid, a so-called diepad, is used as the mounting section of the semiconductor pressure pick-up. The semiconductor chip is subsequently connected to contact sections of the lead grid via bonding wires. In a method referred to as "transfer molding", which is also called transfer forming, the semiconductor pressure pick-up is subsequently embedded in a housing made of mold compound. The pressure feed of the sensor can be effected from the top side of the semiconductor pressure pick-up, or through a pressure channel that is provided in the socket and the mounting section and is connected to the bottom side of the semiconductor pressure pick-up. When implementing the method, care should be taken when injection-molding around the semiconductor pressure pick-up that a pressure feed in the housing is kept free of mold compound. This is accomplished by a tool part which, in the injection molding die, is either pressed against the top side of the semiconductor pressure pick-up, or against the mounting section, depending upon whether the pressure feed is to be effected from the side of the semiconductor pressure pick-up facing away from the lead grid, or from the side facing the lead grid. After injection-molding around, the tool part is removed, causing an opening to remain in the mold compound which is used as a pressure feed.

Disadvantageous in the above-described method is that, when pressing the tool part, the mounting section of the lead grid can shift and a gap develops between the tool part and the mounting section. When injection-molding around, mold compound can get through the gap into the pressure feed and onto the diaphragm of the semiconductor chip, thereby impairing the functioning of the pressure sensor.

SUMMARY OF THE INVENTION

The known disadvantages are avoided by the method of the present invention. This is accomplished by clamping the mounting section within the injection molding die. For this purpose, the mounting section can have a region that extends laterally outwardly from the assembly surface of the semiconductor pressure pick-up and can be clamped simply and reliably in the injection molding die. The lateral enlargement of the mounting section necessitates only a slight alteration of the manufacturing method. Advantageously, by clamping the mounting section in the injection molding die, the mounting section is no longer able to give way when a tool part is pressed against the mounting section or the semiconductor pressure pick-up applied on the mounting section. Thus, the penetration of mold compound between the tool part and the mounting section or, if sealing was carried out on the top side of the semiconductor pressure pick-up, the penetration of mold compound between the tool part and the semiconductor pressure pick-up can be effectively prevented. The method is advantageously very simple and inexpensive to carry out and requires only insignificant alterations.

It is particularly advantageous if a region of the mounting section extending laterally from the assembly region of the semiconductor pressure pick-up is clamped between two die halves of the injection molding die, the die halves making contact with the top side and bottom side of the mounting section.

If a pressure channel is formed underneath the semiconductor pressure pick-up in the mounting section, the pressure channel can be covered particularly well if the entire bottom side of the mounting section facing away from the semiconductor pressure pick-up is covered by the tool part of the injection molding die. On the finish-produced pressure sensor, the side of the mounting section facing away from the semiconductor pressure pick-up is then not embedded in mold compound, and is freely accessible at the bottom side of the housing.

DETAILED DESCRIPTION

Figure 1:
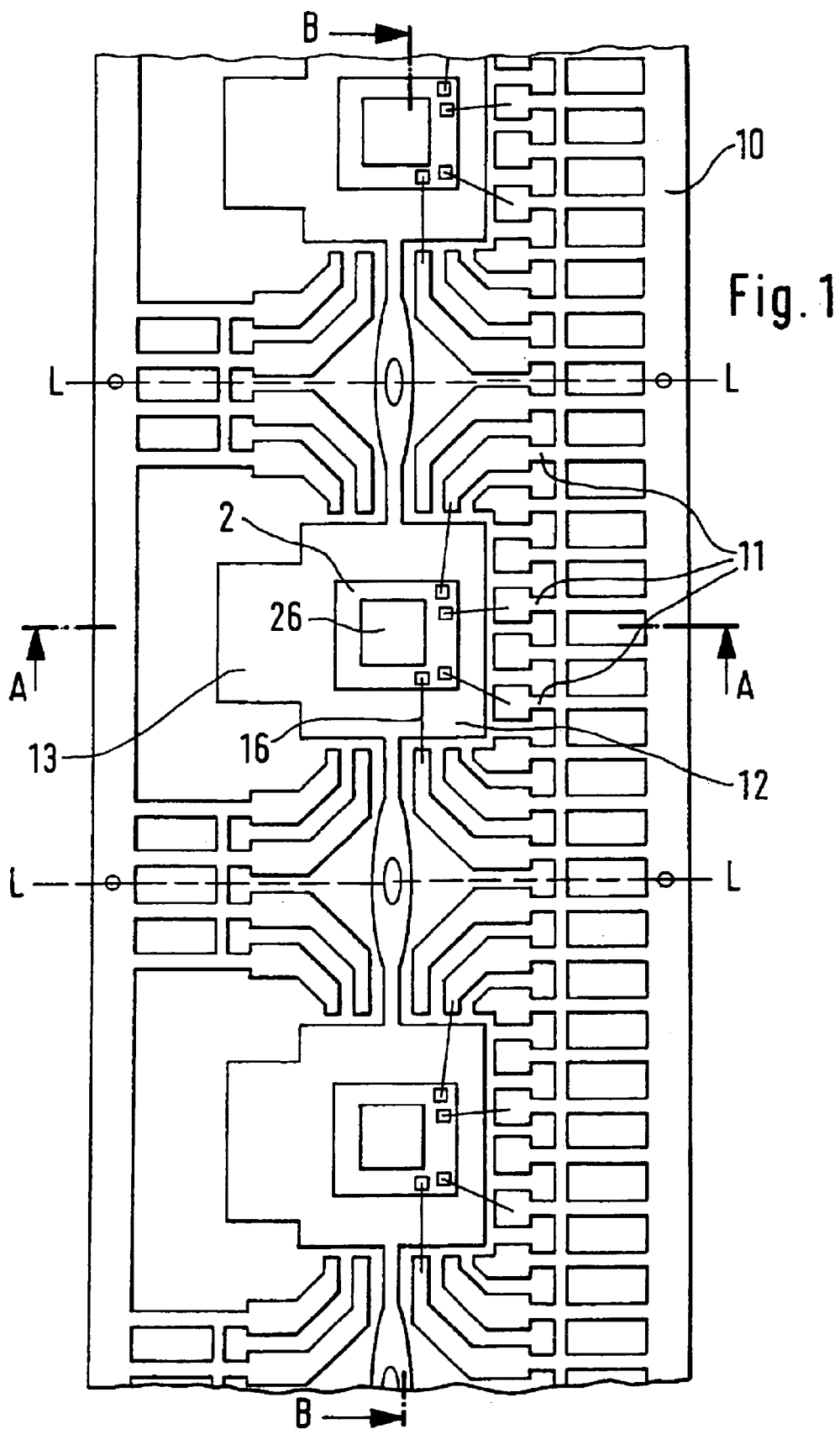
FIG. 1 shows a lead grid having a plurality of sections for mounting semiconductor pressure sensors.
Figure 2:
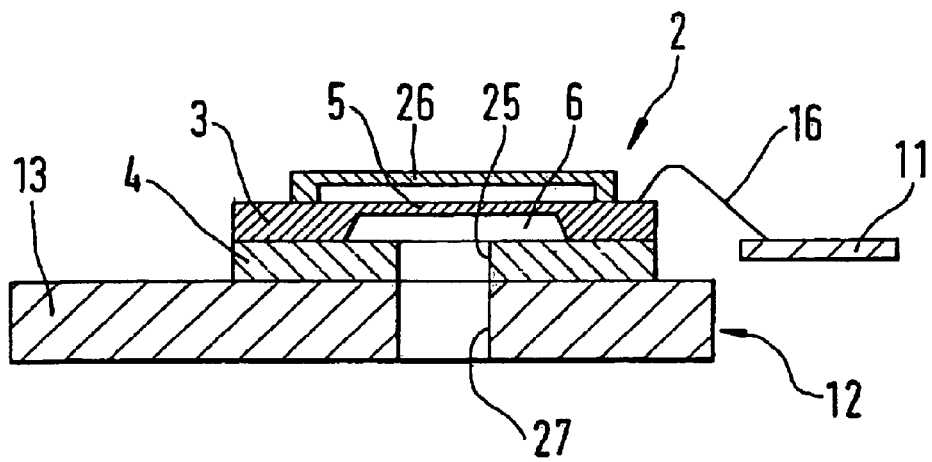
FIG. 2 shows a cross-section through FIG. 1 along line A—A.

A first exemplary embodiment of the method according to the present invention is explained with reference to FIGS. 1 through 4. FIG. 1 shows a lead grid 10, a so-called leadframe. The strip-shaped lead grid 10 can be produced, for example, by punching and bending from a sheet-metal strip or in another form, and in the lengthwise direction of the strip, has a plurality of homogeneously constructed sections which can be separated along line L—L. In this manner, it is possible to produce a plurality of sections from one strip. The pressure sensors are preferably produced in an automated line fabrication. Each region of the line grid between separating lines L—L has a level mounting section 12 for mounting a semiconductor pressure pick-up 2. FIG. 2 shows an intersection through FIG. 1 along line A—A.

Semiconductor pressure pick-up 2 includes a semiconductor chip 3, e.g. a silicon chip, in whose bottom side a recess 6 is introduced. A section of semiconductor chip 3 having reduced material thickness above recess 6 forms a deformable diaphragm 5. Semiconductor chip 3 is mounted with its bottom side on a socket 4, for example, a glass socket or plastic socket. A cutout 25 that is connected to recess 6 is introduced into socket 4. Below socket 4, a further cutout 27 that is aligned with cutout 25 is provided in mounting section 12. Cutout 27 of mounting section 12, cutout 25 of socket 4 and recess 6 form a pressure channel through which pressure can be applied to diaphragm 5 of semiconductor chip 3. The top side of semiconductor chip 3 is covered with a cap or a cover 26, a cavity which is used as a reference space for measuring pressure being formed between the inner side of cover 26 and the top side of semiconductor chip 3. Arranged in known manner on the top side of semiconductor chip 3 are evaluating elements (not shown), by which a deformation of diaphragm 5 is detectable. For example, the evaluating elements can be piezoresistive elements in the area of the diaphragm which are able to detect mechanical strains in diaphragm 5. After mounting semiconductor pressure pick-up 2 on section 12 of lead grid 10, semiconductor chip 3 is electrically connected to contact sections 11 of lead grid 10 via bonding wires 16. The contact sections can subsequently be separated by cutting off or punching the lateral cross bars of the lead grid free. Subject to the elastic tension of bonding wires 16, mounting section 12 can now be moved relative to contact sections 11.

Figure 3:
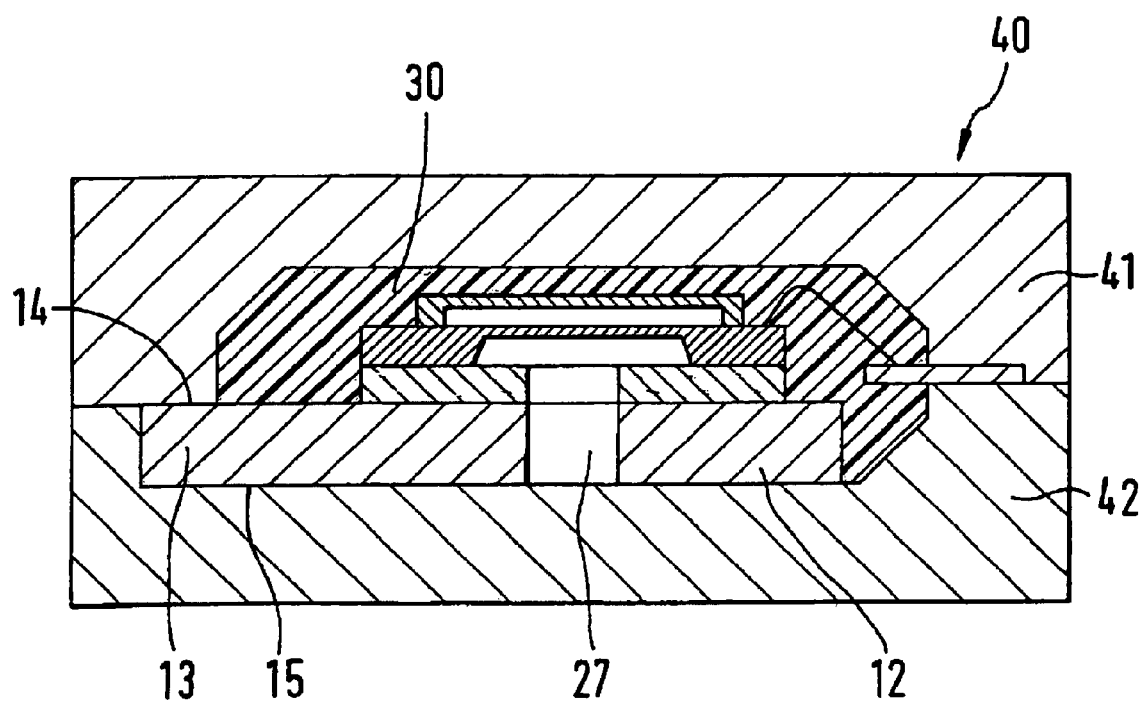
FIG. 3 shows the lead-grid section from FIG. 2 in the injection molding die.

As further shown in FIG. 1 and FIG. 2, a region 13 of mounting section 12 extends beyond the assembly surface of semiconductor pressure pick-up 2, and sticks out laterally from it. Projecting region 13 is used for fastening mounting section 12 in the injection molding die. For this purpose, a lead grid 10 provided with a pressure pick-up 2 is inserted into an injection molding die 40, as is shown in FIG. 3. For example, injection molding die 40 can have a two-part design, with an upper part 41 and a lower part 42. As FIG. 3 shows, projecting region 13 of the mounting section is clamped between upper part 41 and lower part 42 of the injection molding die, so that the position of mounting section 12 is fixed in the die. A section of lower die part 42, which covers the entire bottom side 15 of mounting section 12, and thus pressure channel 27 as well, makes contact at bottom side 15 of mounting section 12. Since mounting section 12 is supported, clamped, in the injection molding die, no gap into which mold compound is able to penetrate can develop between mounting section 12 and lower die part 42. Semiconductor pressure pick-up 2 is subsequently embedded in a housing 30 made of mold compound. This can be done, for example, in a method known as transfer molding or transfer forming, using mold compound such as a thermosetting plastic or resin. In this method, the mold compound is liquified in a chamber of the injection molding die, and is subsequently injected or pressed under pressure into a closed form in which the mold compound hardens. The die parts are subsequently removed from the pressure sensor.

Figure 4:
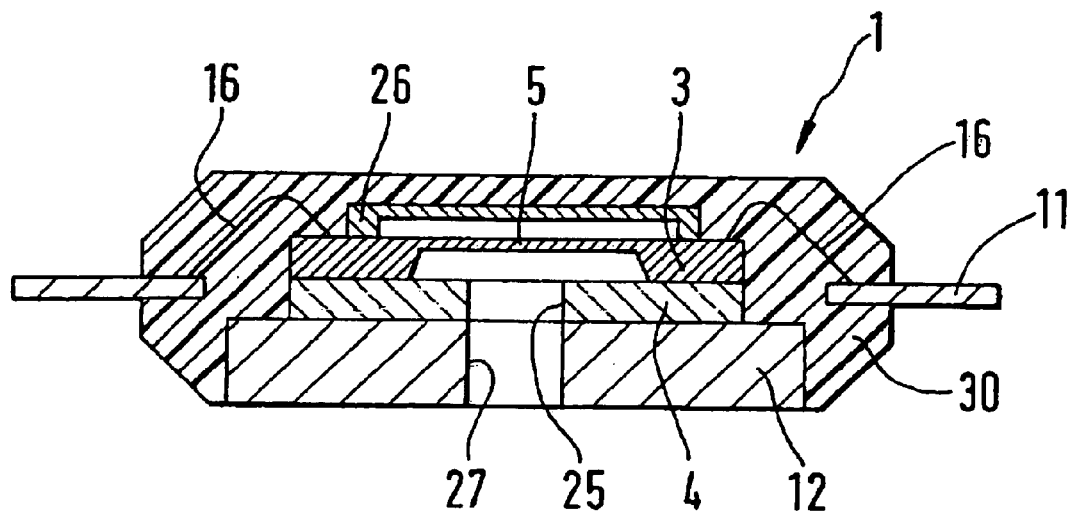
FIG. 4 shows a cross-section through the finished pressure sensor along line B—B from FIG. 1.

FIG. 4 shows a cross-section through finished pressure sensor 1 along line B—B in FIG. 1, thus transverse to the intersection from FIG. 3. Contact sections 11 can still be bent into the form of small leads.

Figure 5:
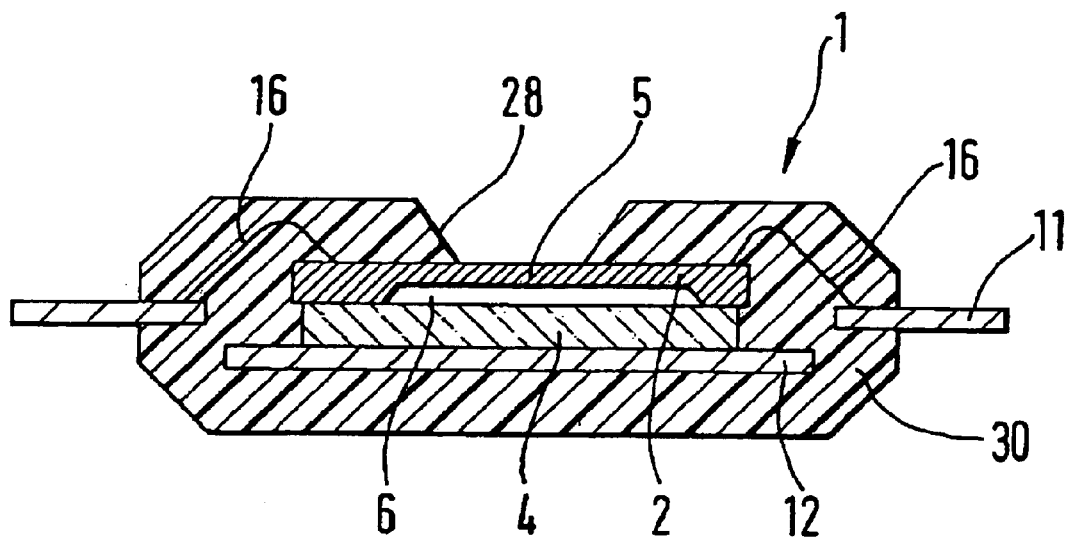
FIG. 5 shows a cross-section through a further exemplary embodiment of a pressure sensor produced according to the method of the present invention.

FIG. 5 shows a cross-section through a further exemplary embodiment of a pressure sensor produced according to the method of the present invention. In this pressure sensor 1, pressure is applied to diaphragm 5 of semiconductor chip 2 through a cutout 28 formed in housing 30. The reference space in this example is formed by recess 6 which is hermetically sealed by socket 4. When producing the pressure sensor, a projection of the upper part of the injection molding die is pressed against diaphragm 5 of semiconductor chip 3, and in this manner, covers it. In this context, mounting section 12, clamped with a region 13 (not visible in FIG. 5) in the injection molding die, is advantageously not able to give way downwards. After injection molding around, the die is removed. The shape of cutout 28 is determined by the projection of the injection molding die. In contrast to the exemplary embodiment of FIG. 4, in this case no cover is necessary. However, a disadvantage compared to the example from FIG. 4 is that diaphragm 5 can be damaged by the pressure of the injection molding die. Unlike in FIG. 4, in FIG. 5 the bottom side of mounting section 12 is likewise embedded in mold compound except for region 13 (not shown). In this example, mounting section 12 has the same thickness as contact sections 11, while in FIG. 4, its thickness is increased. The thickness of socket 4 can compensate for differences in height. Also conceivable are other embodiments of the method in which, for example, two narrow bars of the injection molding die come in contact with mutually opposing sides 14, 15 of mounting section 12.

Using the method of the present invention, the region between the injection molding die and mounting section 12 of the lead grid (FIG. 4), or the region between the injection molding die and the top side of semiconductor pressure pick-up 2 (FIG. 5), is reliably sealed against the penetration of mold compound.

What is claimed is:

1. A method for producing a pressure sensor, comprising the steps of:

mounting a semiconductor pressure pick-up on a mounting section of a lead grid;

electrically connecting the semiconductor pressure pick-up to contact sections of the lead grid;

inserting the lead grid, together with the semiconductor pressure pick-up, into an injection molding die;

bringing one of an upper die part and a lower die part of the injection molding die into contact at one of a side of the semiconductor pressure pick-up facing away from the mounting section and at a side of the mounting section facing away from the semiconductor pressure pick-up;

subsequently enclosing the semiconductor pressure pick-up in the injection molding die by a housing made of a mold compound;

holding clamped the mounting section of the lead grid in the injection molding die when producing the housing, further comprising the steps of:

clamping between the upper die part and the lower die part a region of the mounting section extending laterally from an assembly region of the semiconductor pressure pick-up; and causing one of the upper die part and the lower die part to cover a pressure channel formed in the mounting section below the semiconductor pressure pick-up.

2. The method according to claim 1, wherein:

the lead grid corresponds to a leadframe.

3. The method according to claim 1, wherein:

the upper die part and the lower die part come to rest against a top side and a bottom side of the mounting section.

4. The method according to claim 1, further comprising the step of:

causing the one of the upper die part and the lower die part to cover an entire bottom side of the mounting section facing away from the semiconductor pressure pick-up.

5. A pressure sensor produced according to a method comprising the steps of:

mounting a semiconductor pressure pick-up on a mounting section of a lead grid;

electrically connecting the semiconductor pressure pick-up to contact sections of the lead grid;

inserting the lead grid, together with the semiconductor pressure pick-up, into an injection molding die;

bringing one of an upper die part and a lower die part of the injection molding die into contact at one of a side of the semiconductor pressure pick-up facing away from the mounting section and at a side of the mounting section facing away from the semiconductor pressure pick-up;

subsequently enclosing the semiconductor pressure pick-up in the injection molding die by a housing made of a mold compound;

holding clamped the mounting section of the lead grid in the injection molding die when producing the housing, wherein:

an extension region of the mounting section of the lead grid is not embedded in the mold compound and extends out laterally from the housing of the pressure sensor;

clamping between the upper die part and the lower die part a region of the mounting section extending laterally from an assembly region of the semiconductor pressure pick-up; and causing one of the upper die part and the lower die part to cover a pressure channel formed in the mounting section below the semiconductor pressure pick-up.

* * * * *